United States Patent [19]

Kemp, Jr. et al.

[11] Patent Number: 4,884,754
[45] Date of Patent: Dec. 5, 1989

[54] PROCESS FOR PRODUCING FINE COPPER FLAKES

[75] Inventors: Preston B. Kemp, Jr., Troy, N.Y.; Walter A. Johnson, Houghton, Mich.

[73] Assignee: GTE Products Corporation, Stamford, Conn.

[21] Appl. No.: 292,788

[22] Filed: Jan. 3, 1989

[51] Int. Cl.$^4$ ............................................. B02C 19/12
[52] U.S. Cl. ......................................... 241/5; 241/16; 241/21; 241/29
[58] Field of Search ....................... 241/30, 29, 15, 16, 241/22, 5, 152 A, 24, 21, 172; 75/0.5 R, 0.5 A

[56] References Cited

U.S. PATENT DOCUMENTS

| | | | |
|---|---|---|---|
| 3,186,648 | 6/1965 | Mandle et al. | 241/5 X |
| 4,318,747 | 3/1982 | Ishijima et al. | 241/15 X |
| 4,784,333 | 11/1988 | Hikake et al. | 241/29 X |

*Primary Examiner*—Mark Rosenbaum
*Attorney, Agent, or Firm*—Donald R. Castle

[57] ABSTRACT

A process is disclosed for producing fine copper flakes which comprises media milling copper powder particles with one or more organic surfactants in a non-polar organic medium to comminute the copper particles and produce intermediate flakes having a thickness of less than about 3 micrometers, removing the major portion of the organic medium and the organic surfactants from the intermediate flakes to produce dried intermediate flakes, and fluid energy milling the intermediate flakes to reduce the diameter of the dried intermediate flakes and produce flakes having a diameter of no greater than about 10 micrometers in diameter.

5 Claims, No Drawings

PROCESS FOR PRODUCING FINE COPPER FLAKES

This invention is related to application Ser. Nos. 292791 entitled "Process For Producing Fine Copper With Enhanced Sintertability", and 292790 entitled "Low Oxygen Content Fine Spherical Copper Particles And Process For Producing Same By Fluid Energy Milling And High Temperature Processing", both assigned to the same assignee as the present application and both filed concurrently herewith.

This invention relates to a process for producing ultrafine copper flakes by a process which employs a combination of milling procedures, that is, in which copper powder is first attritor milled and then fluid energy milled.

BACKGROUND OF THE INVENTION

Flake morphology fine metal powders have been used for many decades by the coatings industry. They have been produced in tumbling or rotary ball mills using an organic compound to prevent cold welding of the particles and to reduce oxidation of the powder. A new potential application for flake copper powders, in particular, is electronic circuit boards produced by the thick film process. Thick-film microcircuits are fabricated from specially formulated conductive pastes (sometimes called "inks"). Pastes are commonly comprised of the following three components: (1) the functional element or elements which can be a metal, such as copper, alloy, oxide, or ceramic compound, (2) the binder which serves to bind the particles of the functional element together and to bind the element to the substrate, and (3) the vehicle which can be organic solvents and plasticizers. The vehicle allows for smooth flow in application to the substrate. In this thick-film application the powders must be finer than those previously produced.

The justification for using flake morphology powders in a copper thick film application is as follows: to reduce costs to effectively compete with air fired precious metal systems, it would be desirable to reduce the circuit trace thickness, and thus the amount of copper metal used per unit length of circuit trace. However, the trace thickness must be at least five times the particle thickness to ensure adequate electrical conductivity in the finished circuit trace. Flake morphology particles in a coating system tend to lie with their largest dimensions in the plane of the circuit board and with their thinnest dimension (thickness) in the direction of the circuit trace thickness. This allows the trace to be made thinner, and with a lower oxygen content than by using spherical particles with a diameter equal to the flake thickness (flakes have a lower specific surface area than spherical particles with a diameter equal to the flake thickness). Also the flake morphology particles are less difficult to produce than the previously mentioned spheres. The flake morphology particles must have a relatively small larger dimension as well to allow narrow line widths to be fabricated smoothly.

An upper limit of about 7–10 microns is acceptable for the flake diameter. Flake powders in this size range can be produced by conventional ball milling alone, but the resulting powders are too thin and large diameter particles are present which are difficult to classify out. In addition, milling times are excessively long to produce powders this fine.

SUMMARY OF THE INVENTION

In accordance with one aspect of this invention, there is provided a process for producing fine copper flakes which comprises media milling copper powder particles with one or more organic surfactants in a non-polar organic medium to comminute the copper particles and produce intermediate flakes having a thickness of less than about 3 micrometers, removing the major portion of the organic medium and the organic surfactants from the intermediate flakes to produce dried intermediate flakes, and fluid energy milling the intermediate flakes to reduce the diameter of the dried intermediate flakes and produce flakes having a diameter of no greater than about 10 micrometers in diameter.

DETAILED DESCRIPTION OF THE INVENTION

For a better understanding of the present invention, together with other and further objects, advantages and capabilities thereof, reference is made to the following disclosure and appended claims in connection with the above description of some of the aspects of the invention.

The present invention provides a process for producing fine copper flakes by a combination of attrition (stirred) ball milling and fluid energy milling. This results in production of flake powders of equal to or less than about 10 microns in diameter having a thickness of about <3 microns. There are essentially no large diameter particles present which would otherwise have to be classified out. According to this invention the milling times are considerably shorter than when conventional ball milling alone is used.

The starting powders of the present invention are copper metal powders. The starting powders can be made by any process and can be of any size. For example they can be <about 1000 microns in diameter and are most typically <about 250 micrometers in diameter.

The coarse copper powder particles are first processed in a media mill such as a stirred media mill, for example, a stirred ball mill or attrition mill such as a Union Process Attritor ™ using a non-polar organic medium such as n-heptane and one or more organic surfactants to obtain a flake morphology powder of the correct thickness which is less than about 3 microns. This is most typically about one-fifth the desired circuit trace thickness. The circuit trace thickness is typically about 15 micrometers. A surfactant such as a fatty acid, in particular stearic or oleic acid, is used to prevent cold welding of the particles. The organic surfactant adsorbs to the particle surfaces. This prevents metal to metal contact when two particles are impacted/sheared against one another. Without intimate contact of the metal surfaces, the two particles cannot weld together. The surfactant allows only reduction of the particle size. The particle size does not increase. Particle size is reduced during this media milling step. The main intent is to reduce the thickness to the desired thickness. While the thickness is being reduced, the particle size is reduced also. By "particle size" is meant the weight or volume of the individual particles. The diameter may actually increase.

After the particles reach the desired thickness, (intermediate flakes) they are removed from the mill as a slurry and subsequently dried. This is done most typically by vacuum dryer/blenders to remove the major portion of the organic medium and the surfactants.

At this point the dried intermediate flakes have the desired thickness, but they are generally much too large in flake diameter (largest dimension).

The intermediate flakes are next introduced into a fluid energy mill using high velocity jets of either air or inert gas to entrain the intermediate flakes, impart high velocity to them, and impact them against either a solid substrate or each other. This group of processes is called "jet milling" or "fluid energy milling" including fluidized bed opposed jet milling, the "Coldstream" process in which a stream of gas and the starting material are impinged against a fixed target, etc. All references made herein to "jet milling" or "fluid energy milling" are understood to refer to this group of processes. In the process of the invention, there are no moving parts except for gas compressors to produce the fluid energy stream. Energy is imparted to the particles by the fluid or gas, that is, by the velocity of the fluid. All of these processes impart high velocities to the material which is being ground and impact the accelerated particles against each other or against a solid substrate at a sufficient force to shatter or break the particles into smaller fragments. During this part of the process, the individual flakes tear at cracks present in their outer periphery and are reduced in diameter, while the thickness of the flakes remains the same. In addition, the flakes become more nearly circular when viewed parallel to the thickness direction and the edges are often rounded or rolled up, both which could contribute to less problems in the application as in the screening process in the manufacture of thick films. It is easier to force the rounded edge flakes through the screen during the circuit printing process, than to force a ragged edge flake through. The ragged edges tend to catch on the weave of the screen. Because of the self-classifying nature of typical fluid energy mills, particles above desired upper size limit stay in the milling apparatus until they are reduced in size.

The process of the present invention affords a method for producing copper flake morphology powder at a low cost suitable for use in fabricating thick film electronic circuit boards. One of the primary advantages of the two step process is that the flake thickness and planar dimensions can be independently changed. Powders having the lowest surface area (and therefore, oxygen content) possible to meet the particle size requirements can thus be fabricated.

To more fully illustrate this invention, the following nonlimiting example is presented.

EXAMPLE

Gas atomized copper powder is processed using n-heptane as the milling fluid and oleic acid as the surfactant in a stirred ball mill using tungsten carbide/cobalt media. Proportions of the materials on a weight basis are as follows:

Mill media: 6200 parts
copper powder: 200 parts
n-Heptane: 160 parts
Oleic acid: 1 part.

The powder is milled for about 30 hours at a linear speed of about 364 fpm measured at the outer diameter of the mill agitator to produce flake morphology particles. The particles are removed from the mill as a slurry and filtered and vacuum dried using conventional metal powder processing techniques. The dried particles are next processed in an opposed jet mill using compressed air at inlet pressures of 82-85 psi. The action of the jet mill is to reduce the average diameter of the flake morphology particles without substantially changing their thickness. Size data is shown below:

| Particle Size (Microtrac) | | | |
| --- | --- | --- | --- |
| | Starting powder | Ball milled | Jet Milled |
| Mean size, microns | 14.3 | 10.0 | 5.4 |
| Std. deviation, microns | 8.4 | 7.9 | 4.3 |

Note that the particle size as measured by laser light scattering is greatly reduced by jet milling. Also, the distribution of particle sizes becomes narrower.

While there has been shown and described what are at present considered the preferred embodiments of the invention, it will be obvious to those skilled in the art that various changes and modifications may be made therein without departing from the scope of the invention as defined by the appended claims.

What is claimed is:
1. A process for producing fine copper flakes, said process comprising:
   (a) media milling copper powder particles with one or more organic surfactants in a non-polar organic medium to comminute said copper particles and produce intermediate flakes having a thickness of less than about 3 micrometers;
   (b) removing the major portion of said organic medium and said organic surfactants from said intermediate flakes to produce dried intermediate flakes; and
   (c) fluid energy milling said intermediate flakes to reduce the diameter of said dried intermediate flakes and produce flakes having a diameter of no greater than about 10 micrometers in diameter.
2. A process of claim 1 wherein said surfactants are fatty acids.
3. A process of claim 2 wherein said surfactants are selected from the group consisting of oleic acid, and stearic acid.
4. A process of claim 1 wherein said non-polar organic medium is n-heptane.
5. A process of claim 1 wherein said media milling step is a stirred media milling step.

* * * * *